United States Patent [19]

MacKinnon et al.

[11] Patent Number: 4,603,056

[45] Date of Patent: Jul. 29, 1986

[54] SURFACE TREATMENT OF A MOLYBDENUM SCREENING MASK

[75] Inventors: Donald A. MacKinnon; Pei-Ching Li, both of Hopewell Junction, N.Y.; Henry C. Schick, Annandale, Va.

[73] Assignee: International Business Machines Corporation, Armonk, N.Y.

[21] Appl. No.: 726,871

[22] Filed: Apr. 25, 1985

[51] Int. Cl.$^4$ .............................................. B05D 3/06
[52] U.S. Cl. ........................................ 427/38; 427/39
[58] Field of Search ..................................... 427/38, 39

[56] References Cited

U.S. PATENT DOCUMENTS

| | | | |
|---|---|---|---|
| 3,757,733 | 9/1973 | Reinberg | 118/49.5 |
| 3,764,379 | 10/1973 | Tuttle | 117/212 |
| 4,342,617 | 8/1982 | Fu et al. | 156/643 |
| 4,420,498 | 12/1983 | Hirose et al. | 427/39 |
| 4,429,011 | 1/1984 | Kim et al. | 428/450 |

OTHER PUBLICATIONS

W. Burger et al., "Multi-Layer Ceramics Manufacturing", *IBM J. Res. Develop.*, vol. 27, No. 1, Jan. 1983, pp. 11–19.

H. Okabayashi et al., "A Mo–Nitride/Mo Gate MOS Structure", Abstract No. 302, *Extended Abstracts of ECS, Spring Meeting*, May 10–15, 1981, pp. 753–754.

*Primary Examiner*—Bernard D. Pianalto
*Attorney, Agent, or Firm*—T. Rao Coca

[57] ABSTRACT

Disclosed is a method of treating the surface of a molybdenum mask used for screening a metallized paste pattern to render it smooth and preserve the mask's hardness. The treatment consists of subjecting the mask to a nitridation step by which an ultrathin layer of molybdenum layer is first formed, followed by deposition of a comparatively thick silicon nitride layer thereon. The nitridation step may be accomplished in a plasma deposition system using either forming gas, ammonia or gas mixture of nitrogen and ammonia at a predetermined low temperature and pressure. The silicon nitride deposition may be accomplished in the same system at the same temperature and pressure by substituting the gas utilized to form the molybdenum nitride with a gaseous mixture of silane and one of nitrogen and ammonia.

20 Claims, No Drawings

SURFACE TREATMENT OF A MOLYBDENUM SCREENING MASK

BACKGROUND OF THE INVENTION

This invention relates to a method of treating the surface of a molybdenum mask. More particularly, the invention is a method of treating a molybdenum mask used for screening metallized paste patterns on a substrate to render the mask smooth and preserve its hardness, thereby extending its useful life.

In the manufacture of a multilayer ceramic (MLC) module package such as the multichip module (MCM) which has been specifically designed to serve as a high-density circuit package, the MLC substrate is produced by laminating as many as 33 layers of metallized green sheets and sintering the laminate at high temperatures. Details of the basic MLC manufacturing process are provided, for example, in the article by W. G. Burger and C. W. Weigel entitled "Multi-Layer Ceramic Manufacturing" and are published in IBM Journal of Research and Development, Vol. 27, No. 1, pages 11–29 (January 1983). One of the important steps in the MLC manufacturing process is personalization of each green sheet layer by which unique wiring patterns consisting not only of metallized paste pattern printed on each layer, but also interlevel via holes filled with the metallized paste is provided. Formation of the wiring patterns is accomplished by extruding the metallized paste (typically, a molybdenum-based paste) through thin metal masks, which have a unique pattern of openings of unique dimensions for each layer pattern. More particularly, metallization of the green sheet is accomplished by extruding the metallized paste through a screening nozzle as the nozzle traverses the metal mask in contact with the green sheet.

After each extrusion, the metal mask is subjected to a cleaning step utilizing a suitable solvent such as perchloroethylene to ensure that the mask surfaces and openings are free of any extraneous paste.

Molybdenum foil has been found to be a particularly attractive candidate for a screening mask in this context owing to its inherent rigidity (high tensile strength) and hardness. Rigidity is an essential requirement of a screening mask since in MLC fabrication the mask invariably has openings therein which extend to 30–50 percent of the mask area. Hardness is essential for achieving a high pass factor (which is defined, for the present purposes, as one pass of the screening nozzle over the screening mask personalizing one green sheet by forming a metallized paste pattern thereon). The molybdenum foil derives its tensile strength and hardness from the mechanical rolling and working processes associated with the foil manufacture. The rolling process is believed to form a thin surface layer of a particularly hardened molybdenum on the foil which is responsible for the high tensile strength.

The cleaning of the molybdenum mask after each screening operation, however, tends to quickly destroy the hardened surface layer of the mask. To elaborate on this, molybdenum because of its propensity to getter oxygen readily oxidizes. The molybdenum oxide surface layer formed as a result, in turn, destroys not only the thin surface hardened layer on the mask, but also renders the surface rather rough.

The mechanical paste screening step also contributes to these destructive results since the metallized paste invariably contains 1 micrometer or larger dimension particles (e.g. molybdenum) which act as powerful abrasives during the extrusion and rubbing of the extrusion nozzle with the mask surface. Loss of surface hardness renders the mask nonrigid. Once the mask becomes nonrigid, several undesirable effects would result including formation of electrical shorts in the resulting metallized pattern due to "shifting" of the pattern during the screening step, distortion in the line widths, nonuniformity in the line spacing, distorted line geometry and uneven distribution of the metallized paste leading to uncertainty in sheet resistance, etc.

One way of avoiding the above problems arising from the loss of rigidity of the molybdenum mask is to reduce its pass factor. However, since to fabricate a MLC module a mask set consisting of 13–18 masks needs to be qualified at a time, reduction in pass factor of a single mask in the set translates into higher cost per pass for the set and, therefore, higher cost of manufacture per module.

From a cost standpoint, it is desirable to have a high pass factor even in the case of single layer ceramic package manufacture, particularly in the environment of computer-controlled factory of the future. In such a factory, the mask is coupled to a robot arm which, without the aid of a human operator, repetitiously accomplishes the functions of mating the mask with each green sheet, permitting screening of the metallized paste on the green sheet by extrusion through a moving nozzle, cleaning the mask free of any contaminants or debris by passing it through a cleaner stage and readying for the next job. In this environment, it is essential that human involvement, as that required to replace a worn-out mask, be minimized since such involvement significantly reduces the factory efficiency. In other words, in this computer-controlled factory environment, it is highly desirable to increase the pass factor of the molybdenum masks.

To increase the molybdenum mask pass factor, the surface hardness of the mask needs to be preserved. Attempts were made to preserve the surface hardness by coating the molybdenum mask surface with a material such as Teflon (Trademark of E. I. duPont de Nemours & Co.) However, such coatings suffered from poor adhesion and peeled off during the screening step, owing to the presence of a molybdenum oxide layer formed on the mask surfaces. The oxide layer is formed as a result of the inherent oxidizability of molybdenum.

Reference is made to U.S. Pat. No. 3,764,379 issued to J. W. Tuttle for its disclosure of coating a molybdenum mask employed during evaporation of multimetal (chromium-copper-gold) terminals on semiconductor devices with a 700–3000 Å thick copper layer. The provision of the thick copper layer enables removal, during mask cleaning operation, of the multimetal deposited on the mask with less wearout since the etchant solution used to remove the copper-chromium-copper-gold layer is easier on the mask than the solution used to remove the chromium-copper-gold deposit from the uncoated molybdenum mask. Copper coating would not serve the demands of a molybdenum mask utilized in green sheet screening step since copper easily wears off due to the highly abrasive conditions associated with this step. Another disadvantage is that since copper is readily oxidizable in air, it does not provide an impervious coating.

Accordingly, it is an object of the invention to increase the pass factor of a molybdenum mask used in the manufacture of a metallized ceramic package.

It is a further object of the invention to prolong the useful life of a molybdenum mask by preserving its original surface hardness and smoothness.

SUMMARY OF THE INVENTION

The above objects and other related objects and advantages may be achieved through the use of a novel surface treatment process herein disclosed. In one preferred embodiment of this invention, the process consists of coating the molybdenum mask with a thin adherent layer of molybdenum nitride (MoN) layer followed by forming a comparatively thick silicon nitride layer thereon. In one example, the molybdenum nitride layer is formed by mounting the mask in a low pressure glow discharge plasma deposition system and introducing into the system either forming gas, ammonia, or a mixture of nitrogen and ammonia at a predetermined low temperature (e.g., 250° C.–500° C.) and pressure (0.2–1 torr) for a predetermined time. Then, the silicon nitride is formed in the same system at the same temperature and pressure by substituting the forming gas with either a gaseous mixture of silane and nitrogen or silane and ammonia. The protective dual coating renders the mask surfaces smooth and hard thereby extending its useful life.

DETAILED DESCRIPTION OF THE PREFERRED EMBODIMENT

The novel features, process steps and characteristics of the invention are set forth in the appended claims. The invention itself, however, will be understood by reference to the detailed description which follows.

The invention can be practiced by using any of the low pressure glow discharge plasma deposition systems well-known in the art. One such plasma deposition system is disclosed in U.S. Pat. No. 3,757,733 which is incorporated by reference herein. Since such a system is not the subject of the present invention, the detailed description will focus on the method of forming the protective dual layer rather than the plasma deposition system. The molybdenum mask is mounted on the anode plate of the plasma deposition system by using an appropriate number of standoffs to expose essentially the entire top and bottom surfaces as well as the peripheral edges corresponding to the openings of the mask. It is necessary to form the protective coating on all surfaces including the bottom surface even though the latter is not subjected to the abrasive treatment that the top surface is subjected to, lest, in use, it will oxidize due to various cleaning cycles. The deposited chamber is first evacuated to remove any deleterious gases. The chamber temperature is next raised to a relatively low temperature in the range of approximately 250° C.–500° C. A low temperature in this range is specifically selected to avoid any molybdenum grain growth.

To continue with the present process, next forming gas consisting of a premixed gas mixture having a maximum of 10% of hydrogen and the remainder nitrogen is introduced thereinto. A pressure in the range of 0.2–1 torr is maintained in the chamber. A suitable RF power of about 300 watts is applied between the electrodes. Under these conditions, the forming gas serves two functions. It initially thoroughly cleans the mask surfaces and edges by causing a breakdown and removal of any organic or other contaminants (e.g. molybdenum oxide) introduced into the minute voids and crevices of the molybdenum material during the molybdenum sheet manufacture, mask manufacture or subsequent handling. Simultaneously with this mask cleaning, the forming gas forms an ultrathin layer, also termed as monolayer herein, of molybdenum nitride due to interaction between the molybdenum atoms present in the mask material and the nitrogen atoms present in the forming gas. The rate of deposition of the molybdenum nitirde is rather low, typically about 3–10 Å/minute. This process step is continued for about 8–30 minutes, depositing essentially a 25–250 Å thick and uniform molybdenum nitride layer on all the exposed areas of the mask.

After forming a molybdenum nitride layer of a desired thickness, the forming gas is turned off. Any remaining forming gas in the deposition chamber is bled off followed by simultaneously introducing into the heated chamber a premixed gas consisting of, for example, 2% of silane and 98% of a gas such as nitrogen. An alternate gas mixture for forming the silicon nitride is silane and ammonia. The silane proportion in this premixed gas is generally limited to 2% to minimize the risk of explosion. During this step, the chamber temperature and pressure is maintained at substantially the same settings as in the molybdenum nitride deposition step. Under these conditions, the silane and nitrogen gases combine forming a silicon nitride layer conformally on all the exposed surfaces, including the top and bottom surfaces and the peripheral edges of the mask openings. In a plasma deposition system where the gases are introduced from the top, the thickness of the silicon nitride formed on the bottom surface of the mask would tend to be slightly smaller than that formed on the top surface due to back scatter of the gas constituents entering through the mask openings. The silicon nitride deposition step is continued for about 10–60 minutes resulting in a nitride layer of thickness in the range of approximately 1500–4000 Å.

Another suitable gas for conveniently accomplishing the simultaneous mask cleaning and molybdenum nitride deposition is a mixture consisting of about 10% of nitrogen and 90% of ammonia. A third suitable gas for these purposes is pure ammonia.

In one specific example of treating a molybdenum mask in accordance with the invention, the mask was mounted as explained hereinabove on the anode plate of the plasma system. After evacuating the heating the chamber interior to a temperature of approximately 270° C., a premixed gas consisting of approximately 10% of hydrogen and 90% nitrogen was introduced thereinto at a flow rate of about 1000 cc per minute raising the pressure to about 0.4 torr. By maintaining these conditions for about 15 minutes a molybdenum nitride layer of approximately 100 Å thickness was formed on all the exposed surfaces and edges of the mask. The nitrogen plus hydrogen was then replaced with 2% silane and 98% nitrogen gas mixture at the same temperature and pressure as in the molybdenum nitride forming step. By maintaining these conditions for about 20 minutes, silicon nitride was formed on the molybdenum nitride coating. The thickness of the silicon nitride on the top surface and the peripheral edges of mask openings was approximately 2700 Å and, on the bottom surface, was approximately 2000 Å. A cross-sectional analysis under a scanning electron microscope revealed that the molybdenum nitride layer was essentially uniform in spite of the fact that molybdenum nitride fully filled the deepest voids and crevices in the mask. The coefficient of friction of the silicon nitride and molybdenum nitride coated mask was found to be about 0.7 with (i.e. parallel to) the molybdenum grain and about 0.9 against (i.e. perpendicular to) the grain.

The advantages of the above-described surface treatment process are numerous. First, the monolayer of molybdenum nitride reduces the molybdenum grain size by reducing the voids and crevices. Reduction in grain size means reduction in the propensity for oxidation of the molybdenum surfaces. Second, the dual layer preserves the surface hardness and tensile strength of the mask intact. It is estimated that the treatment extends the pass factor of a mask to 10,000 thereby prolonging the useful life of the mask. A third benefit that enures from the present process is the ultra smooth (low coefficient of friction of typically less than 1) layer of silicon nitride formed conformally over the mask's top and bottom surfaces and the peripheral edges of the openings therein, not only minimizes surface wear by reducing the frictional force between the nozzle head and the mask, but also enables easy removal of any contaminants or metal paste debris present on the mask during cleaning. A fourth benefit is the compatibilty of the coated materials with the green sheet composition. The green sheet material typically contains 3–25% of silicon dispersed in alumina. Due to this inherent silicon constitution of the green sheet, any possible introduction of silicon nitride during screening, for example, due to surface abrasion of the extrusion nozzle against the silicon nitride coating on the mask will not be deleterious. Likewise, the molybdenum nitride material that may be introduced into the metallizing paste screening would not be harmful, since, typically, the paste itself contains a molybdenum base.

In summary, the surface nitridation treatment of molybdenum masks by providing a dual layer consisting of a monolayer of molybdenum nitride and a comparatively thicker layer of silicon nitride, in order, on both the top and bottom surfaces of the mask and the peripheral edges of the mask openings, preserves the surface hardness of the mask. The molybdenum nitride layer serves both as an adhesion layer for the silicon nitride and surface hardness-preserving layer. The silicon nitride renders the mask surface extremely smooth. The next result of these surface layers is that the pass factor of the mask is significantly increased.

Thus, there has been provided in accordance with the invention, a method of treating the surface of a molybdenum mask that fully satisfies the objects and advantages set forth above.

While the invention has been set forth in conjunction with a specific preferred embodiment, it is evident that many alternatives, modifications and variations will be apparent to those skilled in the art in light of the foregoing description. While the process has been described in conjunction with molybdenum masks, it is adaptable for other materials which are capable of nitridation. Likewise, while the process has been described in conjunction with forming a silicon nitride final layer to render the mask surfaces smooth, it is believed that other suitable coatings in place of the silicon nitride include tungsten silicide and molybdenum fluoride. It is therefore contemplated that the appended claims will embrace any such alternatives, modifications and variations as fall within the true scope and spirit of the invention.

We claim:

1. A method of coating a molybdenum surface to preserve its surface hardness, said method comprising:
   forming by plasma deposition a layer of molybdenum nitride on said surface; and
   forming by plasma deposition a layer of silicon nitride on said molybdenum nitride layer.

2. The method as recited in claim 1 wherein said molybdenum nitride layer is relatively thin.

3. The method as recited in claim 2 wherein said silicon nitride layer is relatively thick.

4. The method as recited in claim 2 wherein said molybdenum nitride forming is accomplished by plasma deposition using a gas selected from the group consisting of (a) forming gas, (b) a mixture of nitrogen and ammonia and (c) ammonia.

5. The method as recited in claim 3 wherein said silicon nitride forming is accomplished by plasma deposition using a gaseous mixture of silane and a gas selected from the group consisting of nitrogen and ammonia.

6. A method of treating a molybdenum mask to render its surfaces smooth and preserve the hardness thereof, said method comprising:
   forming by plasma deposition a monolayer of molybdenum nitride on said surface; and
   forming by plasma deposition a silicon nitride layer on said molybdenum nitride monolayer.

7. The method as recited in claim 6 wherein said silicon nitride is relatively thick compared to the thickness of the molybdenum nitride layer.

8. The method as recited in claim 7 wherein the ratio of the thickness of silicon nitride to molybdenum layers is in the range of approximately 6–40.

9. The method as recited in claim 6 wherein said molybdenum nitride forming step is accomplished by plasma deposition using forming gas.

10. The method as recited in claim 6 wherein said molybdenum nitride forming step is accomplished by plasma deposition using nitrogen and ammonia gas mixture.

11. The method as recited in claim 6 wherein said molybdenum forming step is accomplished by plasma deposition using ammonia gas.

12. The method as recited in claim 6 wherein said silicon nitride forming step is accomplished by plasma deposition using a gaseous mixture of silane and nitrogen.

13. A method of treating a molybdenum substrate surface comprising:
   (a) mounting said substrate in a plasma deposition system;
   (b) forming a relatively thin adherent layer of molybdenum nitride on said surface by introducing forming gas into said system at a predetermined low temperature and pressure; and
   (c) forming a relatively thick silicon nitride layer on said molybdenum nitride layer by substituting a mixture of silane and a gas selected from the group consisting of nitrogen and ammonia in place of said forming gas at the same temperature and pressure as in step (b), whereby said substrate surface hardness is preserved and the coefficient of friction thereof is reduced.

14. The method as recited in claim 13 wherein said molybdenum nitride is formed by using nitrogen and ammonia gas mixture.

15. The method as recited in claim 14 wherein said gas mixture consists of 2% silane and 98% of nitrogen gas.

16. The method as recited in claim 13 wherein the thickness range of said molybdenum nitride is approximately 25–250 Å.

17. The method as recited in claim 16 wherein the thickness range of said silicon nitride is approximately 1500–4000 Å.

18. The method as recited in claim 17 wherein said low temperature is in the range of approximately 250–300° C.

19. The method as recited in claim 18 wherein said low pressure is in the range of approximately 0.2–1 torr.

20. The method as recited in claim 18 further including removing contaminants from said surface prior to said molybdenum nitride forming step.

* * * * *